United States Patent
Cideciyan et al.

(10) Patent No.: US 9,007,709 B2
(45) Date of Patent: Apr. 14, 2015

(54) OPTIMUM TAPE LAYOUT SELECTION FOR IMPROVED ERROR CORRECTION CAPABILITY

(71) Applicant: International Business Machines Corporation, Armonk, NY (US)

(72) Inventors: Roy D. Cideciyan, Rueschlikon (CH); Robert A. Hutchins, Tucson, AZ (US); Thomas Mittelholzer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/942,581

(22) Filed: Jul. 15, 2013

(65) Prior Publication Data

US 2015/0015982 A1    Jan. 15, 2015

(51) Int. Cl.
  *G11B 5/09*    (2006.01)
  *G11B 5/008*   (2006.01)

(52) U.S. Cl.
  CPC .................................. *G11B 5/00813* (2013.01)

(58) Field of Classification Search
  None
  See application file for complete search history.

(56) References Cited

U.S. PATENT DOCUMENTS

| | | | |
|---|---|---|---|
| 5,592,497 A | 1/1997 | Lokhoff | |
| 6,282,039 B1 | 8/2001 | Bartlett | |
| 7,127,554 B2 | 10/2006 | Buckingham | |
| 7,876,516 B2 | 1/2011 | Cideciyan et al. | |
| 7,978,427 B2* | 7/2011 | Kobayashi et al. | 360/18 |
| 8,139,304 B2* | 3/2012 | Cideciyan et al. | 360/48 |
| 8,144,414 B2* | 3/2012 | Cherubini et al. | 360/48 |
| 8,276,044 B2* | 9/2012 | Masuda et al. | 714/771 |
| 8,276,045 B2* | 9/2012 | Cideciyan et al. | 714/771 |
| 8,477,446 B2* | 7/2013 | Hutchon et al. | 360/53 |
| 2008/0235556 A1* | 9/2008 | Eleftheriou et al. | 714/755 |
| 2012/0036318 A1* | 2/2012 | Cideciyan et al. | 711/111 |

OTHER PUBLICATIONS

Mittelholzer et al., "Reverse Concatenation of Product and Modulation Codes," IEEE International Conference on Communications, 2008, ICC'08, pp. 1991-1995, IEEE, 2008.

* cited by examiner

*Primary Examiner* — Dismery Mercedes
(74) *Attorney, Agent, or Firm* — Zilka-Kotab, PC (57) ABSTRACT

According to one embodiment, a system for selecting an optimum tape layout to store data on a tape medium may include a processor and logic integrated with and/or executable by the processor, the logic being configured to: select a family of data set layouts based on parameters associated with at least a tape drive and the tape medium, compute a set of all minimum distances for the selected family of data set layouts, calculate a first performance metric associated with each possible set of parameters, select a best first performance metric from all calculated first performance metrics and store a set of parameters associated with the best first performance metric, and select a data set layout algorithm which utilizes the set of parameters associated with the best first performance metric, wherein the data set layout algorithm and a rewrite layout algorithm combine to form an optimum tape layout.

20 Claims, 7 Drawing Sheets

OPTIMUM TAPE LAYOUT SELECTION FOR IMPROVED ERROR CORRECTION CAPABILITY

BACKGROUND

The present invention relates to data storage, and more particularly, to providing improved error correction capability to data read from a tape by selecting an optimum tape layout with which to write data to the tape.

A tape layout scheme used to write data to a tape, such as a magnetic tape used for data storage, is a critical component of a two-level error correction architecture commonly used in magnetic tape drives. Error correction in tape drives is typically based on using a first-level C1 code and a second-level C2 code, a process which is well known in the art.

Figure 1:
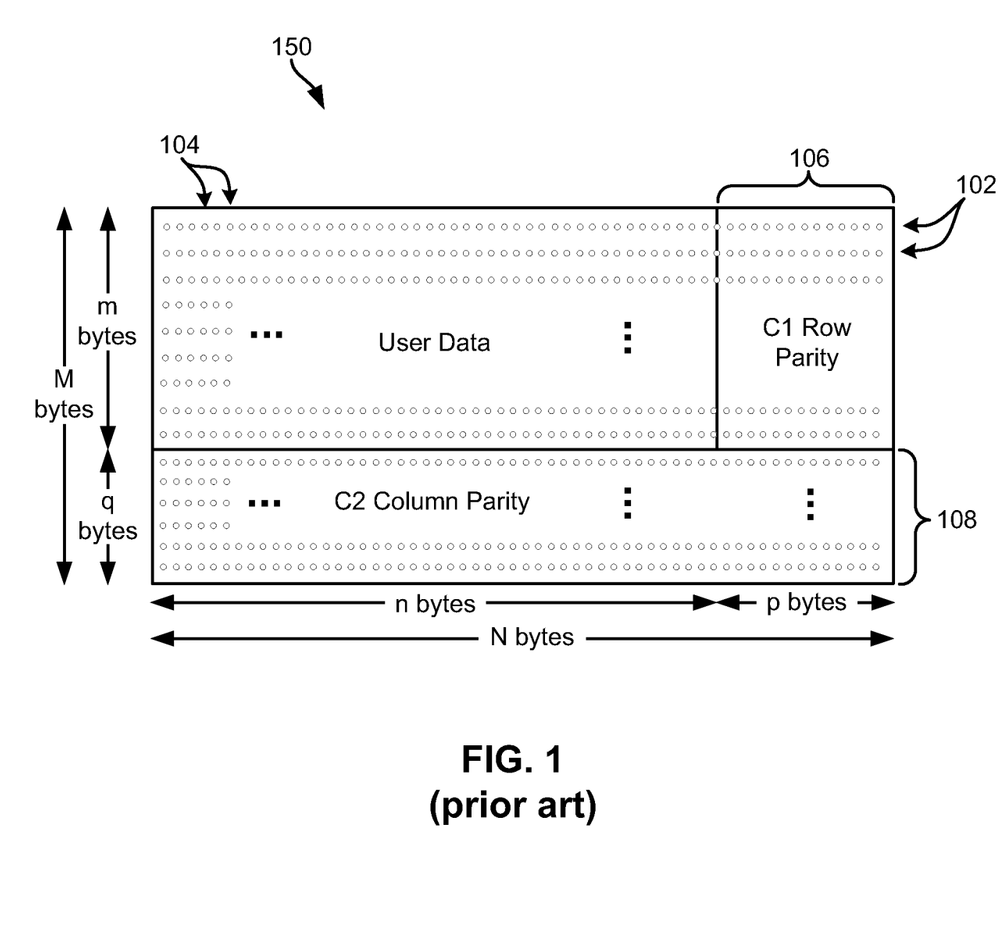
FIG. 1 shows a data set matrix or array, according to the prior art.

Each data set is encoded using interleaved sets of codewords that are organized into an ECC-encoded matrix of size M bytes×N bytes (M×N) and then written to tape as shown in FIG. 1, according to the prior art. There are two levels of encoding within this matrix 150. The first level of encoding utilizes the matrix rows 102. Each row 102 of the matrix contains C1-ECC row parity 106, which adds p-bytes of C1-ECC to the n-bytes of user data (e.g., N=n+p bytes). The second level of encoding, C2-ECC column parity 108, adds q-bytes of C2-ECC to each matrix column 104. For example, if q=12, then adding 12 bytes of C2-ECC would add 12 rows to the matrix 150 (e.g., M=m+q bytes).

The tape layout scheme provides reliable decoding of the two-level error correction code even if errors on the tape are spatially correlated to a large extent. An optimum tape layout design should minimize the correlations between byte errors in a C2 codeword at the C2 decoder input. Therefore, the tape layout scheme should ensure that under normal conditions, the byte errors at the C2 decoder input are as uncorrelated as possible. The first two generations of Linear Tape Open (LTO) tape drives (LTO 1 and LTO 2 tape drives) simultaneously read or write eight tracks of data, whereas the follow-on four generations of LTO tape drives (LTO 3, LTO 4, LTO 5, and LTO 6 tape drives) simultaneously read or write sixteen tracks of data. Next-generation tape drives may be capable of reading or writing even more tracks of data simultaneously.

Various tape layout algorithms have been proposed and used in tape drives. However, the drawbacks associated with current tape layout approaches are two-fold: first, no method for selecting a tape layout scheme that includes a rewrite scheme has been used, and second, there are better performance metrics available for selecting a tape layout scheme aside from maximizing a minimum codeword interleave (CWI) distance as has been used by other conventional methods.

However, regardless of the tape layout scheme that is used or the number of tracks of data that are being written or read simultaneously, if the tape layout scheme is not optimized for decorrelating the byte errors at the C2 decoder input, the data read from the tape will encounter many more uncorrectable errors than is possible using an improved tape layout scheme.

BRIEF SUMMARY

According to one embodiment, a system for selecting an optimum tape layout to store data on a tape medium may include a processor and logic integrated with and/or executable by the processor, the logic being configured to: select a family of data set layouts based on a plurality of parameters associated with at least a tape drive and the tape medium, compute a set of all minimum distances for the selected family of data set layouts, calculate a first performance metric associated with each possible set of parameters from the plurality of parameters, select a best first performance metric from all calculated first performance metrics and store a set of parameters associated with the best first performance metric, and select a data set layout algorithm which utilizes the set of parameters associated with the best first performance metric, wherein the data set layout algorithm and a rewrite layout algorithm combine to form an optimum tape layout.

In another embodiment, a method for selecting an optimum tape layout to store data on a tape medium includes: calculating a first performance metric, determining a data set layout algorithm using the first performance metric, wherein the data set layout algorithm is used to store data to the magnetic tape in a first writing operation, calculating a second performance metric, and determining a rewrite layout algorithm using the second performance metric, wherein the rewrite layout algorithm is used to rewrite data to the magnetic tape after the first write operation, and wherein the data set layout algorithm and the rewrite layout algorithm combine to form an optimum tape layout.

According to another embodiment, a computer program product for selecting an optimum tape layout to store data on a tape medium includes a computer readable storage medium having program code embodied therewith, the program code readable/executable by a hardware processor to: select a family of data set layouts based on a plurality of parameters associated with at least a tape drive and the tape medium, compute, using the processor, a set of all minimum distances for the selected family of data set layouts, calculate, using the processor, a first performance metric associated with each possible set of parameters from the plurality of parameters, select, using the processor, a best first performance metric from all calculated first performance metrics and store a set of parameters associated with the best first performance metric, and select a data set layout algorithm which utilizes the set of parameters associated with the best first performance metric, wherein the data set layout algorithm and a rewrite layout algorithm combine to form an optimum tape layout.

Other aspects and embodiments of the present invention will become apparent from the following detailed description, which, when taken in conjunction with the drawings, illustrates by way of example the principles of the invention.

DETAILED DESCRIPTION

The following description is made for the purpose of illustrating the general principles of the present invention and is not meant to limit the inventive concepts claimed herein.

Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an," and "the" include plural referents unless otherwise specified.

According to one general embodiment, a system for selecting an optimum tape layout to store data on a tape medium may include a processor and logic integrated with and/or executable by the processor, the logic being configured to: select a family of data set layouts based on a plurality of parameters associated with at least a tape drive and the tape medium, compute a set of all minimum distances for the selected family of data set layouts, calculate a first performance metric associated with each possible set of parameters from the plurality of parameters, select a best first performance metric from all calculated first performance metrics and store a set of parameters associated with the best first performance metric, and select a data set layout algorithm which utilizes the set of parameters associated with the best first performance metric, wherein the data set layout algorithm and a rewrite layout algorithm combine to form an optimum tape layout.

In another general embodiment, a method for selecting an optimum tape layout to store data on a tape medium includes: calculating a first performance metric, determining a data set layout algorithm using the first performance metric, wherein the data set layout algorithm is used to store data to the magnetic tape in a first writing operation, calculating a second performance metric, and determining a rewrite layout algorithm using the second performance metric, wherein the rewrite layout algorithm is used to rewrite data to the magnetic tape after the first write operation, and wherein the data set layout algorithm and the rewrite layout algorithm combine to form an optimum tape layout.

According to another general embodiment, a computer program product for selecting an optimum tape layout to store data on a tape medium includes a computer readable storage medium having program code embodied therewith, the program code readable/executable by a hardware processor to: select a family of data set layouts based on a plurality of parameters associated with at least a tape drive and the tape medium, compute, using the processor, a set of all minimum distances for the selected family of data set layouts, calculate, using the processor, a first performance metric associated with each possible set of parameters from the plurality of parameters, select, using the processor, a best first performance metric from all calculated first performance metrics and store a set of parameters associated with the best first performance metric, and select a data set layout algorithm which utilizes the set of parameters associated with the best first performance metric, wherein the data set layout algorithm and a rewrite layout algorithm combine to form an optimum tape layout.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, an electrical connection having one or more wires, an optical fiber, in baseband or as part of a carrier wave, etc. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2A:
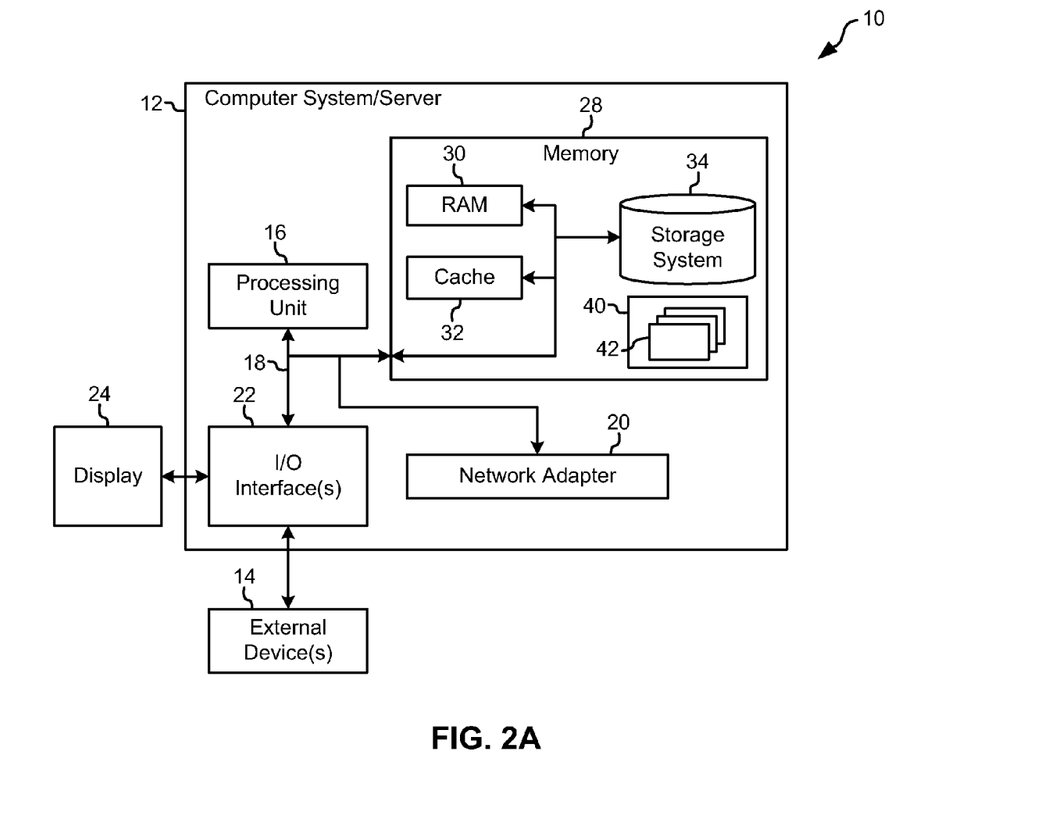
FIG. 2A illustrates a network storage system, according to one embodiment.

Referring now to FIG. 2A, a schematic of a network storage system 10 is shown according to one embodiment. This network storage system 10 is only one example of a suitable storage system and is not intended to suggest any limitation as to the scope of use or functionality of embodiments of the invention described herein. Regardless, network storage system 10 is capable of being implemented and/or performing any of the functionality set forth hereinabove.

In the network storage system 10, there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 2A, computer system/server 12 in the network storage system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 may include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 may be provided for reading from and writing to a non-removable, non-volatile magnetic media—not shown and typically called a "hard disk," which may be operated in a HDD. Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media may be provided. In such instances, each may be connected to bus 18 by one or more data media interfaces. As will be further depicted and described below, memory 28 may include at least one program product having a set (e.g., at least one) of program modules that are configured to carry out the functions of embodiments described herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication may occur via Input/Output (I/O) interfaces 22. Still yet, computer system/ server 12 may communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2B:
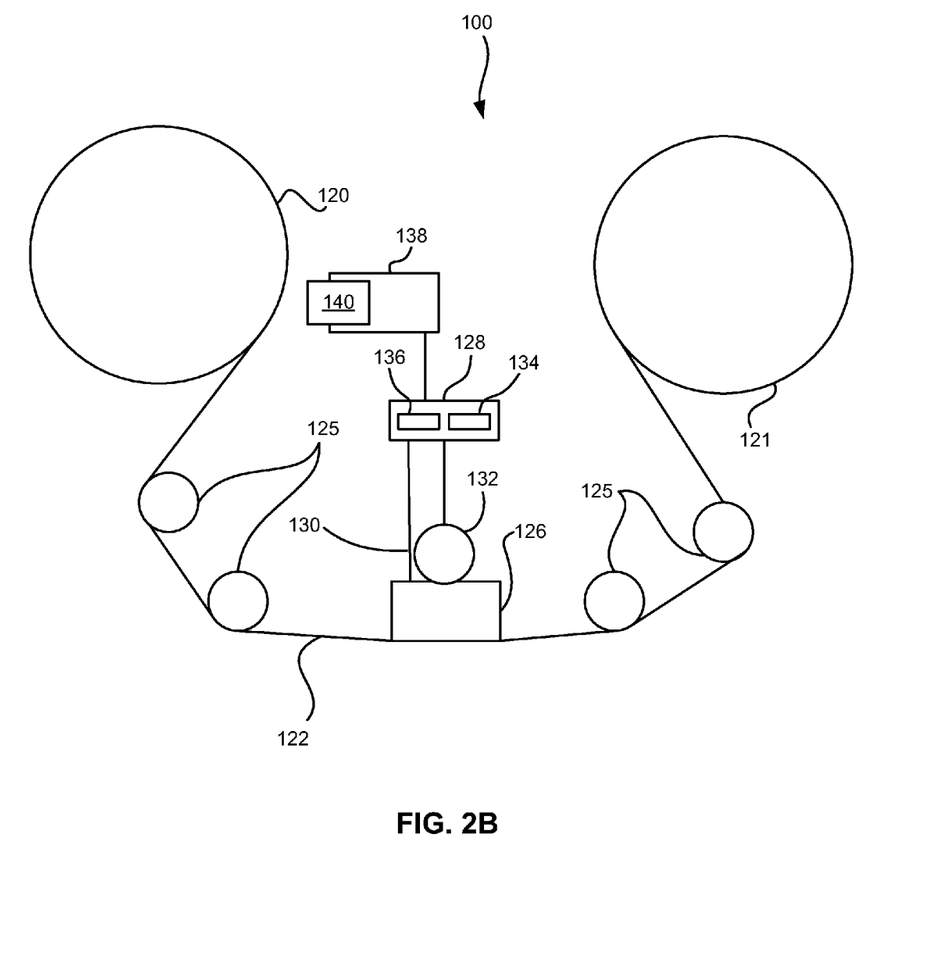
FIG. 2B illustrates a simplified tape drive of a tape-based data storage system, according to one embodiment.

FIG. 2B illustrates a simplified tape drive 100 of a tape-based data storage system, which may be employed according to various embodiments. While one specific implementation of a tape drive is shown in FIG. 2B, it should be noted that the embodiments described herein may be implemented in the context of any type of tape drive system. As shown, a tape supply cartridge 120 and a take-up reel 121 are provided to support a tape 122. One or more of the reels may form part of a removable cassette and are not necessarily part of the tape drive 100. The tape drive 100, such as that illustrated in FIG. 2B, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 2B) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

In one embodiment, the tape drive 100 may comprise a data buffer 138 which is accessible by the tape drive 100 and the controller 128. This data buffer 138 may be organized as a ring buffer and may be split into one or more portions, with one portion being a reserved data buffer 140, which may also be organized into a ring buffer, to be used for storage of partial data sets during reading operations from the tape 122.

An interface may also be provided for communication between the tape drive 100 and a host (integral or external) to send and receive the data and for controlling the operation of the tape drive 100 and communicating the status of the tape drive 100 to the host, as would be understood by one of skill in the art.

One problem which is solved by embodiments described herein is how to select the best possible or optimum tape layout for reliable decoding of data given any set of circumstances or parameters regarding the tape and tape drive.

A comprehensive method for selecting a tape layout based on at least the following four steps is proposed herein according to one embodiment. The first step is to select a family of data set layouts which may be used in the system being analyzed based on an algorithm which takes into account a codeword interleave (CWI) designation, a number of logical data tracks possible on the tape, tape drive reading and writing capabilities, and any other relevant parameters. In the second step, for all possible sets of parameters, a set of minimum distances between a first CWI and all other CWIs in the same sub data set (SDS) is computed. In a third step, a performance metric is computed using the set of minimum distances between the first CWI and all other CWIs in the same SDS, along with any other relevant parameters, and this performance metric may be used to determine a data set layout algorithm given the parameters included in the calculations. In a fourth step, after the best performance metric (largest, smallest, greatest, least, etc., depending on how the metric is calculated) is determined, the set of parameters associated with that best performance metric are selected. These parameters may then be used to devise the data set layout algorithm for storing data to the tape in order to provide the greatest reliability in reading data from the tape. The tape layout is a combination of the data set layout used for writing data to the tape medium in a first writing operation and a rewrite layout algorithm used for rewriting data to the tape medium after it has already been written.

The benefits associated with this method are four-fold: first, for any data set layout algorithm, the method identifies the parameters that lead to the optimum or best data set layout in terms of obtaining the best calculated performance metric; second, the method may be applied to all possible data set layout families and is therefore not limited to a particular family of data set layouts, manufacturer, or any other data set layout constraints; third, the performance metric proposed accounts for a shape of the distribution of all minimum CWI distances on the tape; and fourth, in particular, the best possible track rotation for a particular CWI length and channel spacing may be obtained.

Figure 3A:
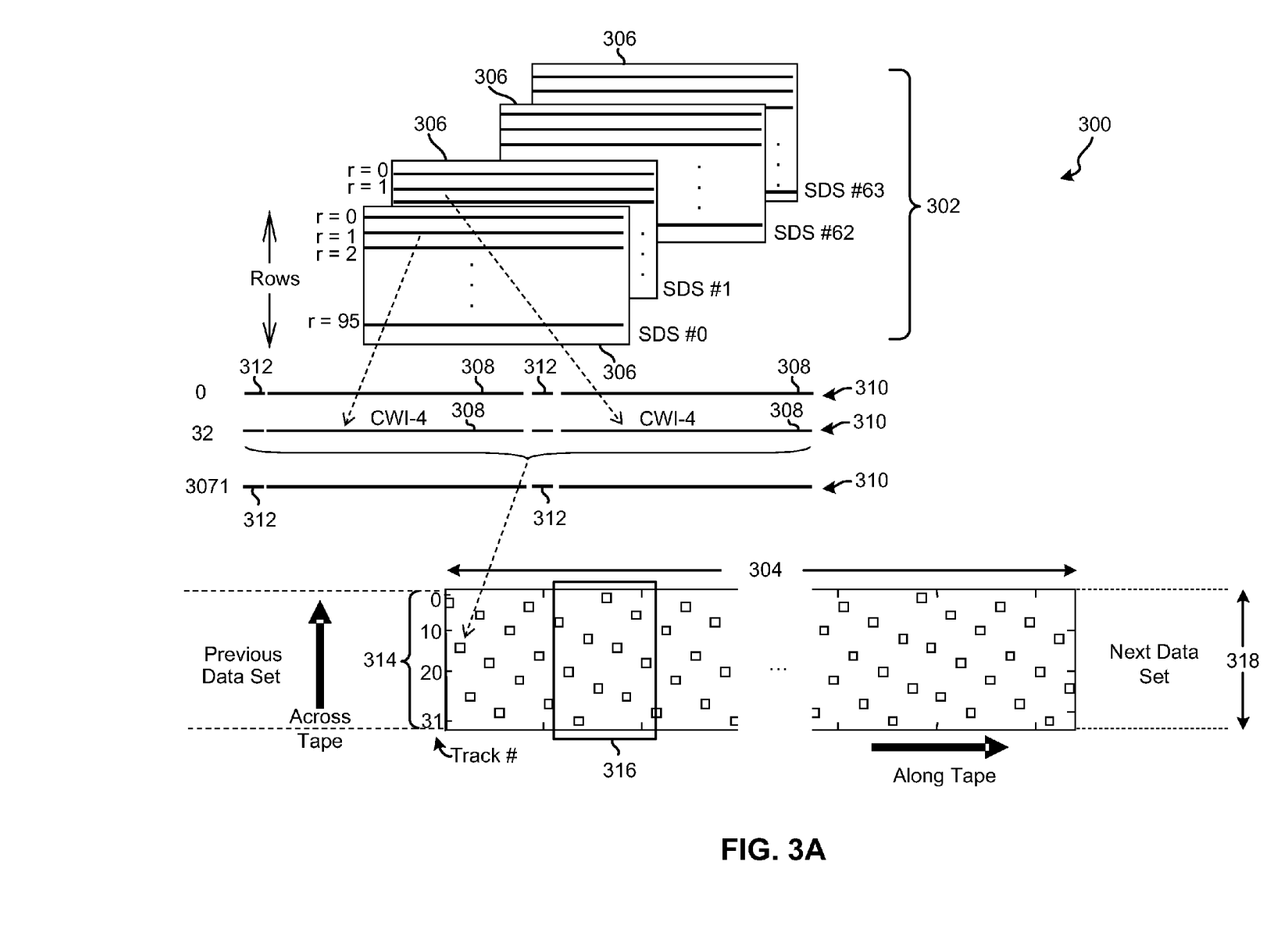
FIG. 3A shows a tape layout, according to one embodiment.

Referring now to FIG. 3A, a data set layout 300 for a Reed-Solomon (RS) C2 code is shown according to one embodiment. Data set layout 300 is for a RS(96,84) C2 code, but any suitable code may be used with the embodiments described herein. As shown, for RS(96,84) the data set 302 size is 6 MB, the data set length 304 on the tape is 73 mm, each sub data set 306 has 96 sets of four interleaved codewords (CWI-4s) 308, a codeword object 310 includes two CWI-4s with the same number (r) from two consecutive sub data sets 306 with two headers 312, and there are 3072 codeword objects 310 per data set 302 mapped onto 32 logical tracks 314 such that a distance between CWI-4s is large, with each CWI-4 308 being separated by about 1 mm allowing for the correction of four dead tracks and 9 mm stripe errors 316.

For example, as shown in FIG. 3A, there are 96 codeword objects 310 of sub data set #0 and sub data set #1 within the data set layout 300. Also, the width 318 of the data set written to tape is about 2.6 mm in one approach, with the total width of the tape being about 12.7 mm.

Figure 3B:
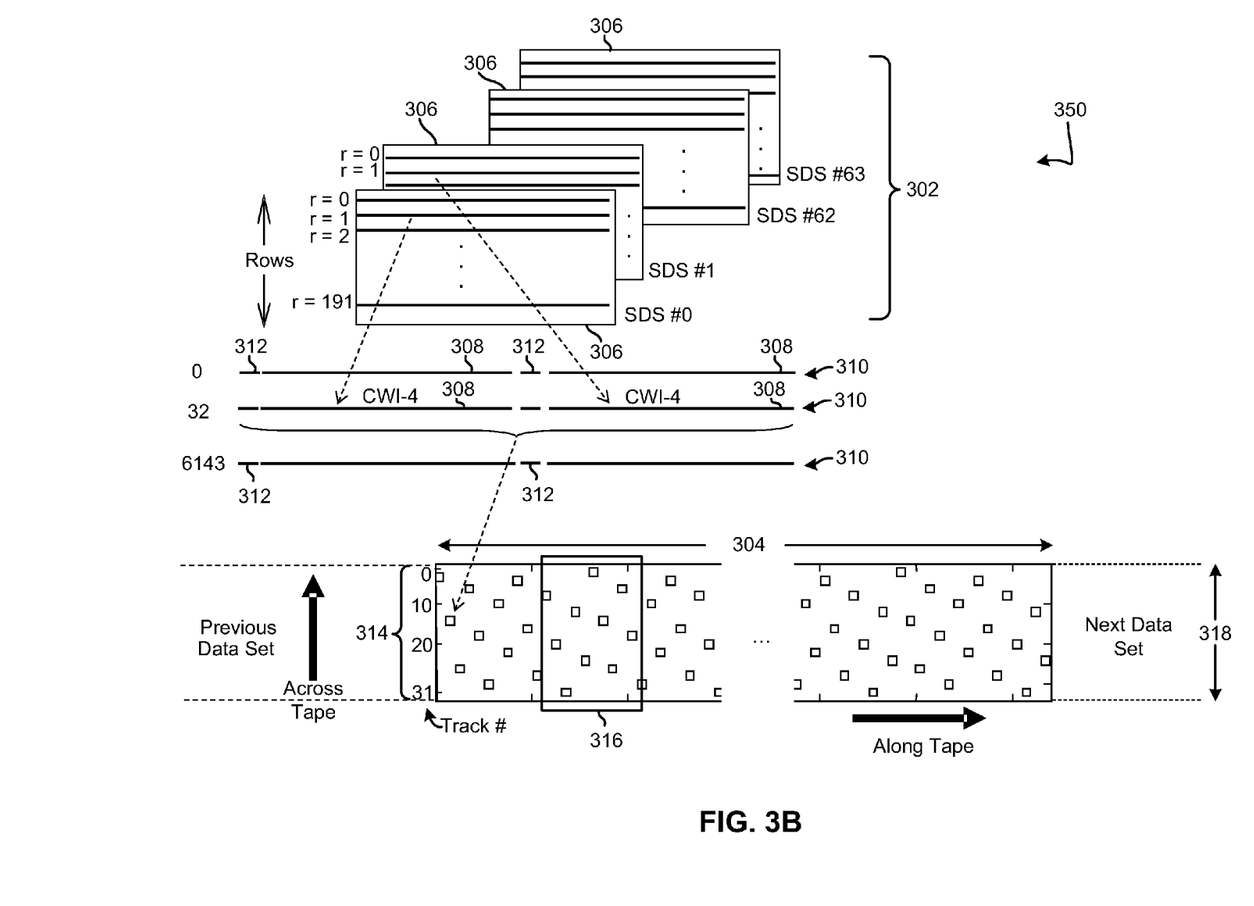
FIG. 3B shows a tape layout, according to another embodiment.

For comparison, as shown in FIG. 3B, if the data set layout 350 uses a RS(192,168) C2 code, the data set 302 size is 12 MB, the data set length 304 is 146 mm, each sub data set 306 has 192 sets of CWI-4s 308, and there are 6144 codeword objects 310 per data set 302 mapped onto 32 logical tracks 314 allowing for the correction of four dead tracks and 18 mm stripe errors 316.

One of the first steps in optimizing a tape layout, as described herein according to various embodiments, requires determining a family of data set layouts. What constitutes a family of data set layouts is now described.

In a data set layout, there are a predetermined number of sub data sets (SDS) per data set (DS). This number is referred to as N, so that there are N SDS per DS. In one embodiment, N=64, but any number of SDS per DS may be used, such as N=32, 128, etc. In addition, there are a predetermined number of channels in the tape drive, referred to as M. In one embodiment, there may be 32 channels, but any number of channels may be used, such as M=16, 64, etc. In addition, in one embodiment, N/M=2, but any ratio may be used, such as 1, 1.5, 2.5, 2⅓, 1⅔, 3, etc.

Furthermore, the CWI-4 designation (y) is a function of the logical track number (t) and the CWI-4 set number (c). R is a variable used to indicate track rotation between consecutive CWIs in a SDS. L is a length of the C2 code being used, such as L=96, L=192, etc. The logical track number (t) ranges from 0 to M−1, such as t=0, 1, . . . , 31 for M=32, etc. The CWI-4 set number (c) ranges from 0 to (N/M)L−1, such as c=0, 1, . . . , 383, for N/M=2 and L=192, etc. Also, the CWI-4 designation (y) ranges from 0 to NL−1, such as y=0, 1, . . . , 12287 for N=64 and L=192, etc. In one embodiment, the following relationship may be adhered to by the data set layout.

$$y=N\times\mathrm{floor}(c/(N/M))+\mathrm{mod}((\mathrm{mod}(c,N/M)+\mathrm{mod}(\mathrm{floor}(c/L),N/M)),N/M)+(N/M)\times\mathrm{mod}(t-R\times\mathrm{floor}(c/(N/M)),M)$$

Therefore, the data set layout is dictated by several parameters, some or all of which may vary from one data set layout family to the next. These parameters include, but are not limited to, N, M, R, and L. Inputs may include t and c, with y being an output from the calculated relationship.

According to one embodiment, a family of data set layouts may have the following parameters: N=64, M=32, R=15, and L=192.

Figure 4:
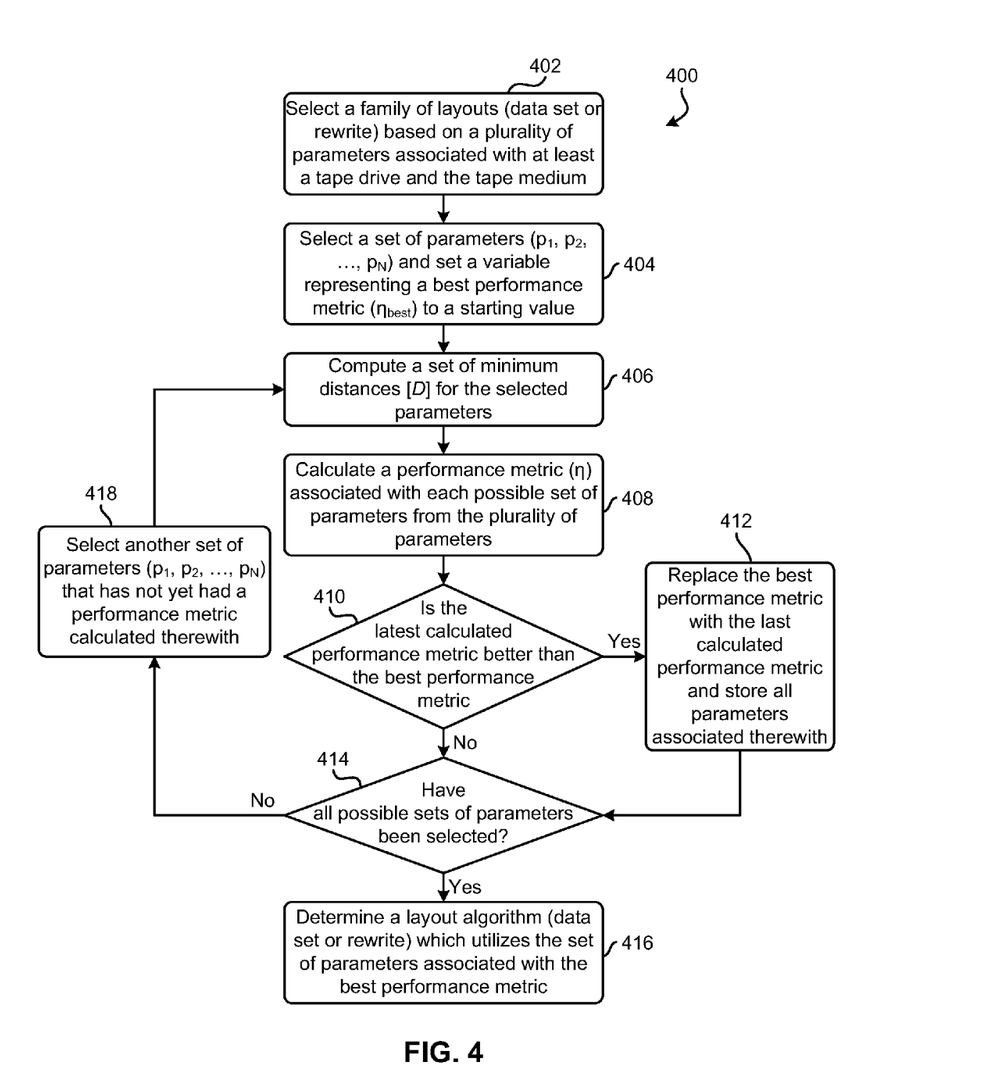
FIG. 4 is a flowchart of a method according to one embodiment.

Now referring to FIG. 4, a flowchart of a method 400 for selecting an optimum tape layout on a tape medium is shown according to one embodiment. The method 400 may be performed in accordance with the present invention in any of the environments depicted in FIGS. 1-3, among others, in various embodiments. Of course, more or less operations than those specifically described in FIG. 4 may be included in method 400, as would be understood by one of skill in the art upon reading the present descriptions. In one approach, the tape medium may be any suitable magnetic data storage tape as known in the art.

Each of the steps of the method 400 may be performed by any suitable component of the operating environment. For example, in various non-limiting embodiments, the method 400 may be partially or entirely performed by a tape drive, an optical drive, a processor (such as a CPU, an ASIC, a FPGA, etc.) which may be embedded in and/or operate within a system, etc.

The method 400 may include, in simple terms, calculating a first performance metric, determining an optimum data set layout algorithm using the first performance metric, wherein the data set layout algorithm is used to store data to the magnetic tape in a first writing operation, calculating a second performance metric, and determining a rewrite layout algorithm using the second performance metric, wherein the rewrite layout algorithm is used to rewrite data to the magnetic tape after the first write operation.

Furthermore, the rewrite layout algorithm may use a different rotation parameter than the data set layout algorithm, the first performance metric may be based on a minimum distance between CWIs in a SDS, while the second performance metric may be based on a minimum distance between CWIs in a SDS.

In this way, an optimum tape layout algorithm which includes the data set layout and the rewrite layout algorithm may be determined.

As shown in FIG. 4, method 400 may initiate with operation 402, where a family of layouts (either a data set layout family for a first writing operation or a rewrite layout family for any rewritten data) is selected based on a plurality of parameters ($p_1, p_2, \ldots, p_N$) associated with at least a tape drive and the tape medium. In one embodiment, the family of layouts may be selected based on a function of the plurality of parameters ($p_1, p_2, \ldots, p_N$).

In one embodiment, the plurality of parameters ($p_1, p_2, \ldots, p_N$) may be dictated by the tape drive, tape medium, one or more user's desires, or some combination thereof. For example, a user may desire that only 32 channels of a 64 channel tape drive be used. In another example, a tape medium may only be capable of holding 32 tracks of data, and therefore a tape drive capable of writing 64 tracks of data may only be used to write 32 tracks of data. Of course, many other situations are possible which may limit and/or dictate the various parameters used to select the layout family.

According to one embodiment, the layout family, such as a layout family determined by CWI designation (y), may be selected based on a function of a set of parameters and one or more inputs from the tape drive and/or the tape medium. In one embodiment, the function receives input(s) of certain values. In a further embodiment, these values which are input include at least: the logical track number (t) and the CWI-4 set number (c).

The function may be calculated based on one or more of the following parameters: a variable used to indicate track rotation between consecutive CWIs in a SDS (R), a length of the C2 code being used (L), a number of SDS per DS (N), and a number of channels in the tape drive (M). For example, the function may be y=$f$(t, c, $p_1, p_2, \ldots, p_N$).

According to a further embodiment, the function may be represented by:

$$y=N\times\mathrm{floor}(c/(N/M))+\mathrm{mod}((\mathrm{mod}(c,N/M)+\mathrm{mod}(\mathrm{floor}(c/L),N/M)),N/M)+(N/M)\times\mathrm{mod}(t-R\times\mathrm{floor}(c/(N/M)),M)$$

The floor and modulo or modulus (mod) functions are mathematical functions known in the art. The floor function, when presented with a real number, returns a largest previous integer less than the real number. For example, floor(6.5)=6, because the floor function returns the largest integer not greater than 6.5. The modulo function finds the remainder of a division operation of one number by another number. For example, mod(5,2)=1, because 5 divided by 2 is 2½, the 1 being returned by the modulo function.

Of course, any other function which provides for a value which may be used to divide layout schemes into families may be used, as would be understood by one of skill in the art upon reading the present descriptions.

In operation 404, a set of parameters ($p_1, p_2, \ldots, p_N$) are selected and a variable representing a best (whether that means that it is greater than, less than, closer to some number, etc.) performance metric ($\eta_{best}$) is set to a starting value, such as zero ($\eta_{best}$=0) or some other beginning value suitable for the selected performance metric and the calculation used therewith, such as 1, −1, 100, etc. The performance metric which is used may be specific to a certain family of layouts, or may be universally applicable to all layout families, or to a subset of layout families. In addition, more than one performance metric may be used to determine the best layout, and in a further embodiment, these multiple performance metrics may be combined into a single performance metric, or used individually.

In operation 406, a set of all minimum distances is computed and/or determined for the selected set of parameters in the selected family of layouts. Each minimum distance is computed between a first CWI and all other CWIs in a common sub data set (SDS), these calculations being repeated for each possible position on the tape. In one embodiment, where a function, g, is computed according to a minimum distance (dmin) between the CWI at position (t,c) and all other CWIs in the same SDS as the CWI at position (t,c), the set of minimum distances [D] may be computed according to the following equation:

$$[D]=\{dmin\,|\,dmin=g(t,c) \text{ for all } t \text{ and } c\}$$

In operation 408, a performance metric ($\eta$) associated with each possible set of parameters from the plurality of parameters is calculated, e.g., according to a predetermined equation. A different performance metric may be used for calculating a data set layout algorithm versus calculating a rewrite layout algorithm, or the same performance metric may be used. In one embodiment, when n is a predetermined multiplier greater than zero (e.g., 2, 3, 5, from 1 to 10, etc.), $\sigma$ is the standard deviation of the set of minimum distances [D], and [$\overline{D}$] is the mean of the set of minimum distances [D], the performance metric ($\eta$) may be calculated based on the following equation:

$$\eta=[\overline{D}]-(n\times\sigma)$$

In operation 410, it is determined whether the latest calculated performance metric ($\eta$) is better (whether that means that it is greater, less, closer to some number, etc.) than the best performance metric ($\eta_{best}$). If it is, then the method 400 continues to operation 412; otherwise, the method 400 continues to operation 414.

In operation 412, the best (whether it is the maximum, minimum, closest to a number, etc.) performance metric ($\eta_{best}$) is replaced and/or set as the last calculated performance metric ($\rho$) and all associated parameters, e.g., the set of parameters ($p_1, p_2, \ldots, p_N$), used to obtain the now best performance metric ($\eta_{best}$) are stored.

In other words, the best performance metric from all calculated performance metrics is determined and the set of parameters associated with the best performance metric are stored to a memory for use in creating the layout (data set layout or rewrite layout) associated with the best performance metric.

In operation 414, it is determined whether all possible sets of parameters have been selected (in order to determine a performance metric ($\eta$) associated with a particular set of parameters). If so, then the method 400 continues to operation 416; otherwise, the method 400 continues to operation 418.

In operation 416, a layout (data set layout or rewrite layout) that utilizes or otherwise adheres to the set of parameters which produced the best performance metric ($\eta_{best}$) is selected to be included in the optimum tape layout.

Of course, as parameters are changed, due to any factors such as upgrades, wear and tear, use, etc., the optimum tape layout may also change. Accordingly, method 400 may be executed periodically (every hour, every day, every week, etc.) or in response to some change in a system which utilizes method 400 (such as a new tape being loaded, different data being stored, cartridge load/unload, etc.), in various embodiments.

In operation 418, another set of parameters ($p_1, p_2, \ldots, p_N$) that has not yet had a performance metric calculated therewith are selected (the set of parameters have not yet been selected in operation 404) and the method 400 returns to operation 408.

In a further embodiment, the method 400 may further include determining a best track rotation (R) for rewriting data by calculating a second performance metric for each possible track rotation while holding some or all other parameters of the set of parameters associated with the best first performance metric constant in order to determine the best track rotation for rewriting data using a rewrite layout algorithm. In this way, the track rotation may be varied and the second performance metric may be calculated at each track rotation, thereby allowing for a largest minimum distance between CWIs to be determined, and the track rotation associated therewith may be selected for rewriting data to the tape medium using the rewrite layout algorithm.

According to one embodiment, the method 400 may be performed by a system. For example, the system may be configured for selecting an optimum tape layout, and the system may comprise a processor (such as a CPU, ASIC, FPGA, IC, etc.) and logic integrated with and/or executable by the processor. The logic may be hardware, software, or some combination thereof, and may be configured to execute one or more operations of method 400, and may be configured to perform additional functions not specifically described herein, in various approaches.

In another embodiment, a computer program product may be designed for selecting an optimum tape layout, the computer program product comprising a computer readable storage medium having program code embodied therewith. In one embodiment, the program code may be readable and/or executable by a device, such as a tape drive, processor, etc., to execute one or more operations of method 400, and may be configured to perform additional functions not specifically described herein, in various approaches.

According to some approaches, a tape layout algorithm may not only include the data set layout algorithm, which determines how data set(s) are written to a tape for the first time, but also a rewrite layout algorithm which is used to rewrite data which is determined to not have been recorded to the tape properly the first time.

According to one embodiment, an efficient rewrite layout scheme may be employed in the context of method 400, where when a data set is written using a read-while-write capable device, all faulty data packets (CWI-4s) detected during read-while-write are collected in a pool and rewritten after the data set is completely written and at the end of the now-written data set. This methodology increases rewrite efficiency and therefore reduces rewrite area that is used on the tape. In addition, cartridge capacity that is wasted in case of permanent dead tracks is reduced from about 50% to about 4%, a vast improvement.

A rewrite layout algorithm that ensures large spacing between rewritten data packets (CWI-4s) in the same sub data set may be used, according to one embodiment. This rewrite layout algorithm is designed with a rewrite table that provides for good ECC performance, faulty data packets are collected in a number (B) of buffers (such as 32 buffers, 64 buffers, etc.) and rewritten at the end of the data set, and faulty data packets from a sub data set (SDS 2k) and a next sub data set (SDS 2k+1) are collected in a buffer (k), where k=0, 1, . . . , B−1, where B is the total number of buffers available. Any type of buffer may be used, such as first-in-first-out (FIFO) buffers, etc.

Figure 5:
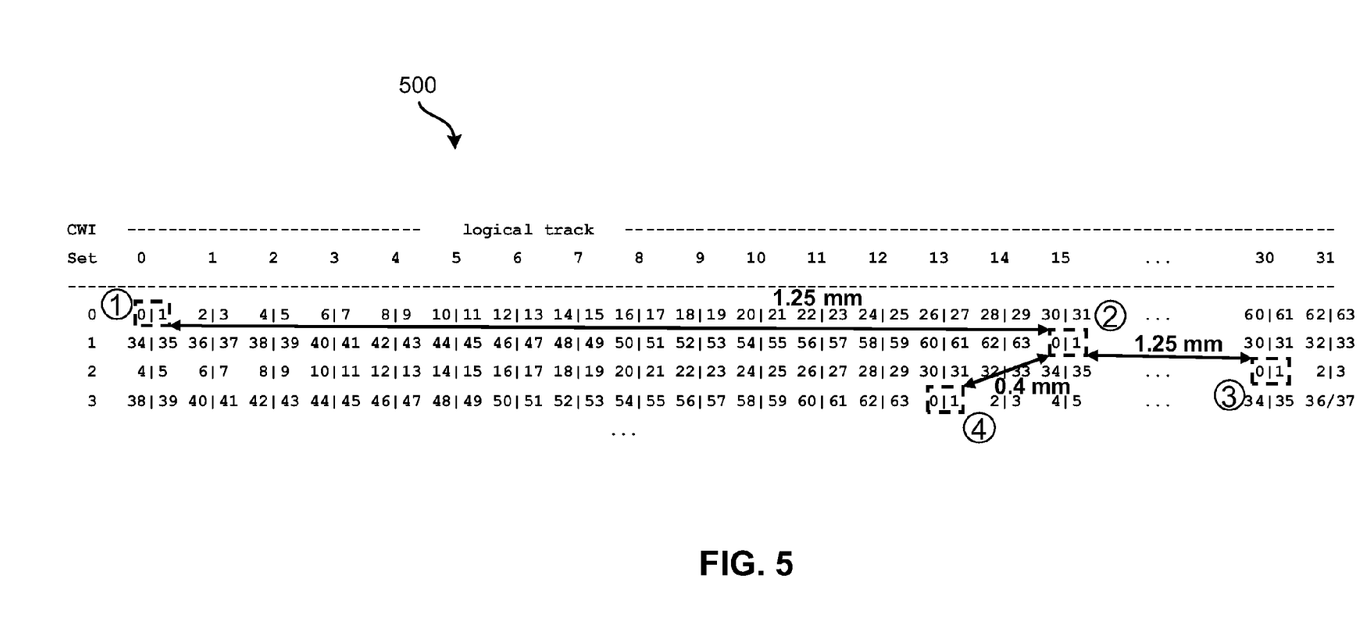
FIG. 5 shows an exemplary table that has rewritten packets from a data set on tape.

Referring now to FIG. 5, a table 500 is shown that has rewritten packets (CWI-4s) from a data set on tape according to one exemplary embodiment. The rewrite layout algorithm is based on the tape layout algorithm where y=f(t, c, $p_1$, $p_2$, . . . , $p_N$), i.e., the rewrite layout algorithm uses the tape layout algorithm. For exemplary purposes, it is assumed that these packets have been rewritten using a rewrite layout algorithm with the same rotation as the data set layout algorithm that was used for the initial writing of the data to the tape to produce the tape layout shown in table 500, which as shown are based on track rotation R=15, with each table 500 entry being a FIFO buffer number.

It is noted that the rewrite layout algorithm is different than the writing (data set layout) algorithm when the data set is written the first time. However, the spirit of the two algorithms is the same in that they distribute the CWI-4s as far apart from each other as possible. The data set layout algorithm always writes a fixed amount of CWI-4s equal to N−L, whereas the number of rewritten CWI-4s is variable depending on how many faulty CWI-4s have been detected. Furthermore, another difference between the algorithms is that the rewrite layout algorithm tries to use tape space efficiently whereas this is not an issue for the data set layout algorithm. In other words, the rewrite layout algorithm tries to write the faulty CWI-4s in as small space as possible such that the CWI-4s from the same SDS are as far apart from each other as possible. Clearly, this requires that competing goals are somehow balanced. If the rewrite layout algorithm is very space-efficient, the distances between CWI-4s gets very small. On the other hand, if a large distance between rewritten CWI-4s is obtained, the rewrite layout algorithm is not space efficient, i.e., it may utilize a lot of tape space.

In order to provide a better chance of decoding the data from the tape, a larger minimum distance is beneficial between not only first written CWIs in the original tape layout but also any rewritten CWIs from the same SDS. That is to say, rewritten CWIs also benefit from a larger minimum distance between the rewritten CWIs from the same SDS.

In the following, it is assumed that the distance between two adjacent simultaneously written channels on tape is 0.08325 mm and the length of a CWI-4 is 0.38 mm. For example, the circled number 1 indicates rewritten packet #1 from SDS 0 or 1, the circled number 2 indicates rewritten packet #2 from SDS 0 or 1, the circled number 3 indicates rewritten packet #3 from SDS 0 or 1, and the circled number 4 indicates rewritten packet #4 from SDS 0 or 1. As can be seen in FIG. 5, the distance between rewritten packet #1 and rewritten packet #2 is 1.25 mm, the distance between rewritten packet #2 and rewritten packet #3 is 1.25 mm, the distance between rewritten packet #3 and rewritten packet #4 is 1.3 mm, and the distance between rewritten packet #1 and rewritten packet #4 is 1.4 mm. However, the distance between rewritten packet #2 and rewritten packet #4 is only 0.4 mm. Therefore, the minimum distance between rewritten CWIs from the same SDS is only 0.4 mm. It would be more advantageous if this minimum distance could be increased.

In order to ensure that rewritten CWIs from the same SDS have a sufficient minimum distance therebetween to provide reliable decoding thereof, a different track rotation (R) may be used to rewrite data to the tape than was used to initially write the data to the tape according to the selected tape layout. As described previously, N is the number of SDS per DS and M is the number of channels on the tape drive. If it is assumed that N=64 and M=32, a family of rewrite layouts to which the situation shown in FIG. 5 belongs may be described, according to one embodiment, by the following equation.

$$\text{floor}(s/2) = \text{mod}(t - R \times c, 32)$$

In this equation, t is the logical track number (ranging from 0 to 31), c is the CWI-4 set number (ranging from 0 to X−1, where X is a variable representing a number of rewritten CWI-4 sets which is unknown prior to writing the data for the first time using the data set layout algorithm), and s is the SDS number to which faulty the CWI-4s belong (ranging from 0 to 63). The parameter in this equation are the same as before: R (specifying track rotation between rewritten CWIs in an SDS), with inputs being t and c, and the output being s. In FIG. 5, the above described rewrite layout algorithm with a rotation parameter of R=15 is shown.

Alternatively, the family of rewrite layouts shown in FIG. 5 may be described according to another embodiment, where N is the number of SDSs per DS, e.g., 64, and M is the number of channels, e.g., 32. The CWI-4 Designation in the data set layout y belongs to the SDS v where v=mod(y, N). In the rewrite table shown in FIG. 5, the set of SDSs u may be determined based on the following equation.

$$u = \{s, s+1, \ldots, s+N/M-1\} = s|s+1| \ldots |s+N/M-1$$

A rewritten CWI-4 is taken from this set of SDSs, u, and may be expressed as a function of the logical track number (t, ranging from 0 to M−1) and CWI-4 set number (c, ranging from 0 to c_max−1) according to the following equation.

$$s = (N/M) \times \text{mod}(t - R \times c, M)$$

R is a parameter specifying track rotation and the period of the rewrite table is M rows (CWI-4 sets). In this specific example shown in FIG. 5, the equation may be simplified by inserting the values for M and N, where N=64 and M=32 as follows.

$$s = 2 \times \text{mod}(t - R \times c, 32)$$

R is a parameter specifying track rotation and the period of the rewrite table is 32 rows (CWI-4 sets). Accordingly, the optimum track rotation may be determined separately for the data set layout algorithm and for the rewrite layout algorithm.

In order to determine which rewrite track rotation should be used, method 400 as shown in FIG. 4 may be used to again determine the best (second) performance metric based on changing the track rotation (R) parameter, and keeping all other parameters constant as were used in the original tape layout. In doing so, it can be determined which track rotation results in the best performance metric. Calculations have shown that by using IBM tape drives with M=32 channels and tapes having a linear density above 500 kilobits per inch (kbpi), track rotation R=13 produces the best performance metric for first writing to tape, while track rotation R=11 produces the best performance metric for rewriting data to tape. Rewritten data using R=11 on IBM tapes resulted in a minimum distance of 0.765 mm, much greater than the 0.4 mm produced by track rotation R=15 shown in FIG. 5. In fact, for a linear density of 535 kbpi, a rewrite utilizing track rotation R=15 resulted in a smallest distance between CWIs of 0.415 mm, R=13 resulted in a smallest distance of 0.629 mm, and R=9 resulted in a smallest distance of 0.749 mm. Therefore, surprisingly, a track rotation of R=9 resulted in better spacing than the original tape layout of R=13.

Of course, other tape formats may produce different results, and the track rotation resulting in the best performance metric may be determined using the methods disclosed herein for any set of parameters and tape layout.

In one embodiment, the set of minimum distances [D] for the rewrite layout algorithm, which may be optimized using the second performance metric, may be selected to have minimum distances of all CWI-4s that are in one period of the rewrite layout table. In the example provided above in FIG. 5, this would correspond to M*M=32*32=1024 minimum distances in [D], i.e., [D]=1024.

In short, track rotation during rewrite may be selected independently from the track rotation selected for the original tape layout.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system for selecting an optimum tape layout to store data on a tape medium, the system comprising a processor and logic integrated with and/or executable by the processor, the logic configured to:
   select a family of data set layouts based on a plurality of parameters associated with at least a tape drive and the tape medium;
   compute a set of all minimum distances for the selected family of data set layouts, wherein each minimum distance is computed between a location of a first codeword interleave (CWI) and locations of all other CWIs in a common sub data set (SDS);
   calculate a first performance metric associated with each possible set of parameters from the plurality of parameters using the set of all minimum distances for the selected family of data set layouts;
   select a best first performance metric from all calculated first performance metrics and store a set of parameters associated with the best first performance metric; and
   select a data set layout algorithm which utilizes the set of parameters associated with the best first performance metric,
   wherein the data set layout algorithm and a rewrite layout algorithm combine to form an optimum tape layout.

2. The system as recited in claim 1, wherein the family of data set layouts is selected based on a function of a set of parameters and one or more inputs from the tape drive and/or the tape medium, the one or more inputs comprising at least:
   a logical track number on the tape medium (t) and a four codeword interleave (CWI-4) set number (c), wherein the function is represented by:
   $y = N \times \text{floor}(c/(N/M)) + \text{mod}((\text{mod}(c, N/M) + \text{mod}(\text{floor}(c/L), N/M)), N/M) + (N/M) \times \text{mod}(t - R \times \text{floor}(c/(N/M)), M)$,
   where y is a codeword designation, R is a variable used to indicate track rotation between consecutive codeword interleaves (CWIs) in a sub data set (SDS), L is a length of a C2 code being used to encode data, N is a number of SDSs per data set (DS), and M is a number of channels in the tape drive.

3. The system as recited in claim 1, wherein the plurality of parameters comprise at least: a variable used to indicate track rotation between consecutive codeword interleaves (CWIs) in a sub data set (SDS), a length of a C2 code being used to encode data, a number of SDSs per data set (DS), and a number of channels in the tape drive.

4. The system as recited in claim 3, wherein the set of minimum distances, [D], is computed using a function, g, where $[D] = \{d_{min} | d_{min} = g(t, c) \text{ for all } t \text{ and } c\}$, wherein $d_{min}$ is a minimum distance between each CWI at various positions (t,c) and all other CWIs in the common SDS as the CWI at the various positions (t,c), a logical track number on the tape medium is denoted by t, and a four codeword interleave (CWI-4) set number is denoted by c.

5. The system as recited in claim 4, wherein each first performance metric associated with a set of parameters is computed using a relationship: $\eta = [\overline{D}] - (n \times \sigma)$, where $\eta$ is the first performance metric, $[\overline{D}]$ is a mean of the set of minimum distances [D], n is a multiplier from 1 to 10, and $\sigma$ is a standard deviation of the set of minimum distances [D], and wherein the best first performance metric is selected as being a maximum of all the calculated first performance metrics.

6. The system as recited in claim 1, wherein the logic is further configured to:
   select a family of rewrite layouts based on a plurality of parameters associated with at least a tape drive and the tape medium;
   compute a set of all minimum distances for the selected family of rewrite layouts;
   calculate a second performance metric associated with each possible set of parameters from the plurality of parameters using the set of all minimum distances for the selected family of rewrite layouts;
   select a best second performance metric from all calculated second performance metrics and store a set of parameters associated with the best second performance metric,
   wherein the rewrite layout algorithm that utilizes the set of parameters associated with the best second performance metric is chosen.

7. The system as recited in claim 6, wherein the second performance metric is based on minimum distances between a location of a first codeword interleave (CWI) and locations of all other CWIs in a common sub data set (SDS), and wherein a second performance metric which maximizes a smallest minimum distance among the set of all minimum distances is selected as the best second performance metric.

8. A method for selecting an optimum tape layout to store data on a tape medium, the method comprising:
   selecting a family of data set layouts based on a plurality of parameters associated with at least a tape drive and the tape medium;
   calculating a first performance metric based on a set of all minimum distances for the selected family of data set layouts, wherein each minimum distance is computed between a location of a first codeword interleave (CWI) and locations of all other CWIs in a common sub data set (SDS);
   determining a data set layout algorithm using the first performance metric, wherein the data set layout algorithm is used to store data to the magnetic tape in a first writing operation;
   calculating a second performance metric; and
   determining a rewrite layout algorithm using the second performance metric, wherein the rewrite layout algorithm is used to rewrite data to the magnetic tape after the first write operation,
   wherein the data set layout algorithm and the rewrite layout algorithm combine to form an optimum tape layout.

9. The method as recited in claim 8, wherein the rewrite layout algorithm uses a different rotation parameter than the data set layout algorithm.

10. The method as recited in claim 8, wherein the first performance metric is based on a minimum distance between codeword interleaves (CWIs) in a sub data set (SDS), and wherein the second performance metric is based on a minimum distance between codeword interleaves (CWIs) in a sub data set (SDS).

11. The method as recited in claim 8, further comprising:
computing the set of all minimum distances for the selected family of data set layouts, wherein the first performance metric associated with each possible set of parameters from the plurality of parameters is calculated using the set of all minimum distances for the selected family of data set layouts;
selecting a best first performance metric from all calculated first performance metrics and store a set of parameters associated with the best first performance metric; and
wherein the data set layout algorithm that utilizes the set of parameters associated with the best first performance metric is selected.

12. The method as recited in claim 11, wherein the family of data set layouts is selected based on a function of a set of parameters and one or more inputs from the tape drive and/or the tape medium, the one or more inputs comprising at least: a logical track number on the tape medium (t) and a four codeword interleave (CWI-4) set number (c), and wherein the function is represented by y=N×floor(c/(N/M))+mod((mod(c,N/M)+mod(floor(c/L),N/M)),N/M)+(N/M)×mod(t−R×floor(c/(N/M)),M), where y is a codeword designation, R is a variable used to indicate track rotation between consecutive codeword interleaves (CWIs) in a sub data set (SDS), L is a length of a C2 code being used to encode data, N is a number of SDSs per data set (DS), and M is a number of channels in the tape drive.

13. The method as recited in claim 12, wherein the plurality of parameters comprise at least: a variable used to indicate track rotation between consecutive codeword interleaves (CWIs) in a sub data set (SDS), a length of a C2 code being used to encode data, a number of SDSs per data set (DS), and a number of channels in the tape drive, wherein each minimum distance is computed between a location of a first codeword interleave (CWI) and locations of all other CWIs in a common sub data set (SDS), wherein the set of minimum distances, [D], is computed using a function, g, where [D]={dmin|dmin=g(t,c) for all t and c}, wherein dmin is a minimum distance between each CWI at various positions (t,c) and all other CWIs in the common SDS as the CWI at the various positions (t,c), a logical track number on the tape medium is denoted by t, and a four codeword interleave (CWI-4) set number is denoted by c, wherein each first performance metric associated with a set of parameters is computed using a relationship: η=[$\overline{D}$]−(n×σ), where η is the first performance metric, [$\overline{D}$] is a mean of the set of minimum distances [D], n is a multiplier from 1 to 10, and σ is a standard deviation of the set of minimum distances [D], and wherein the best first performance metric is selected as being a maximum of all the calculated first performance metrics.

14. The method as recited in claim 8, further comprising:
selecting a family of rewrite layouts based on a plurality of parameters associated with at least a tape drive and the tape medium;
computing a set of all minimum distances for the selected family of rewrite layouts;
calculating the second performance metric associated with each possible set of parameters from the plurality of parameters using the set of all minimum distances for the selected family of rewrite layouts; and
selecting a best second performance metric from all calculated second performance metrics and store a set of parameters associated with the best second performance metric, wherein the rewrite layout algorithm that utilizes the set of parameters associated with the best second performance metric is chosen.

15. The method as recited in claim 14, wherein a second performance metric which maximizes a smallest minimum distance among the set of all minimum distances is selected as the best second performance metric.

16. A computer program product for selecting an optimum tape layout to store data on a tape medium, the computer program product comprising a computer readable storage medium having program code embodied therewith, the program code readable/executable by a hardware processor to:
select a family of data set layouts based on a plurality of parameters associated with at least a tape drive and the tape medium;
compute, using the processor, a set of all minimum distances for the selected family of data set layouts, wherein each minimum distance is computed between a location of a first codeword interleave (CWI) and locations of all other CWIs in a common sub data set (SDS);
calculate, using the processor, a first performance metric associated with each possible set of parameters from the plurality of parameters using the set of all minimum distances for the selected family of data set layouts;
select, using the processor, a best first performance metric from all calculated first performance metrics and store a set of parameters associated with the best first performance metric; and
select a data set layout algorithm which utilizes the set of parameters associated with the best first performance metric,
wherein the data set layout algorithm and a rewrite layout algorithm combine to form an optimum tape layout.

17. The computer program product as recited in claim 16, wherein the family of data set layouts is selected based on a function of a set of parameters and one or more inputs from the tape drive and/or the tape medium, the one or more inputs comprising at least: a logical track number on the tape medium (t) and a four codeword interleave (CWI-4) set number (c), and wherein the function is represented by y=N×floor(c/(N/M))+mod((mod(c,N/M)+mod(floor(c/L),N/M)),N/M)+(N/M)×mod(t−R×floor(c/(N/M)),M), where y is a codeword designation, R is a variable used to indicate track rotation between consecutive codeword interleaves (CWIs) in a sub data set (SDS), L is a length of a C2 code being used to encode data, N is a number of SDSs per data set (DS), and M is a number of channels in the tape drive.

18. The computer program product as recited in claim 16, wherein the plurality of parameters comprise at least: a variable used to indicate track rotation between consecutive codeword interleaves (CWIs) in a sub data set (SDS), a length of a C2 code being used to encode data, a number of SDSs per data set (DS), and a number of channels in the tape drive, wherein each minimum distance is computed between a location of a first codeword interleave (CWI) and locations of all other CWIs in a common sub data set (SDS), wherein the set of minimum distances, [D], is computed using a function, g, where [D]={dmin|dmin=g(t,c) for all t and c}, wherein dmin is a minimum distance between each CWI at various positions (t,c) and all other CWIs in the common SDS as the CWI at the various positions (t,c), a logical track number on the tape medium is denoted by t, and a four codeword interleave (CWI-4) set number is denoted by c, wherein each first performance metric associated with a set of parameters is computed using a relationship:η=[$\overline{D}$]−(n×σ), where η is the first performance metric, [D] is a mean of the set of minimum distances [D], n is an integer multiplier from 1 to 10, and σ is a standard deviation of the set of minimum distances [D], and wherein the best first performance metric is selected as being a maximum of all the calculated first performance metrics.

19. The computer program product as recited in claim 16, wherein the program code is further readable/executable by the hardware processor to:
- select a family of rewrite layouts based on a plurality of parameters associated with at least a tape drive and the tape medium;
- compute a set of all minimum distances for the selected family of rewrite layouts;
- calculate a second performance metric associated with each possible set of parameters from the plurality of parameters using the set of all minimum distances for the selected family of rewrite layouts;
- select a best second performance metric from all calculated second performance metrics and store a set of parameters associated with the best second performance metric,
- wherein the rewrite layout algorithm that utilizes the set of parameters associated with the best second performance metric is chosen.

20. The computer program product as recited in claim 19, wherein a second performance metric which maximizes a smallest minimum distance among the set of all minimum distances is selected as the best second performance metric.

* * * * *